(12) United States Patent
Lee

(10) Patent No.: US 7,417,497 B2
(45) Date of Patent: Aug. 26, 2008

(54) PWM MODULATOR AND CLASS-D AMPLIFIER HAVING THE SAME

(75) Inventor: Jong-Haeng Lee, Daejeon (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 39 days.

(21) Appl. No.: 11/611,220

(22) Filed: Dec. 15, 2006

(65) Prior Publication Data

US 2007/0273436 A1 Nov. 29, 2007

(30) Foreign Application Priority Data

May 13, 2006 (KR) .................. 10-2006-0043172

(51) Int. Cl.
*H03F 3/38* (2006.01)
(52) U.S. Cl. ..................... 330/10; 330/251
(58) Field of Classification Search ............ 330/10, 330/251, 207 A
See application file for complete search history.

(56) References Cited

U.S. PATENT DOCUMENTS

| | | | |
|---|---|---|---|
| 6,362,683 B1 * | 3/2002 | Miao et al. ............... | 330/10 |
| 6,882,225 B2 | 4/2005 | Deletraz | |
| 7,248,193 B2 * | 7/2007 | Fujimoto ................ | 341/143 |
| 7,262,658 B2 * | 8/2007 | Ramaswamy et al. ...... | 330/251 |
| 7,271,650 B2 * | 9/2007 | Lee ............................ | 330/10 |
| 2004/0232978 A1 | 11/2004 | Easson et al. | |

FOREIGN PATENT DOCUMENTS

| JP | 2005229306 | 8/2005 |
|---|---|---|
| KR | 1020050000423 | 1/2005 |

* cited by examiner

*Primary Examiner*—Henry K Choe
(74) *Attorney, Agent, or Firm*—F. Chau & Assoc., LLC

(57) ABSTRACT

A pulse width modulation (PWM) modulator includes an integrator generating an integrated signal based on an input signal and an output signal, a low pass filter (LPF) receiving the integrated signal and performing low pass filtering, a comparator receiving an output signal of the LPF and a predetermined reference signal, comparing the received signals, and outputting a PWM signal, a dead time setup block outputting a first signal and a second signal having a predetermined phase difference therebetween based on the PWM signal, and a power stage buffering the first and second signals and generating the output signal based on a result of buffering. In the PWM modulator and a class-D amplifier having the PWM modulator, EMI can be reduced.

16 Claims, 11 Drawing Sheets

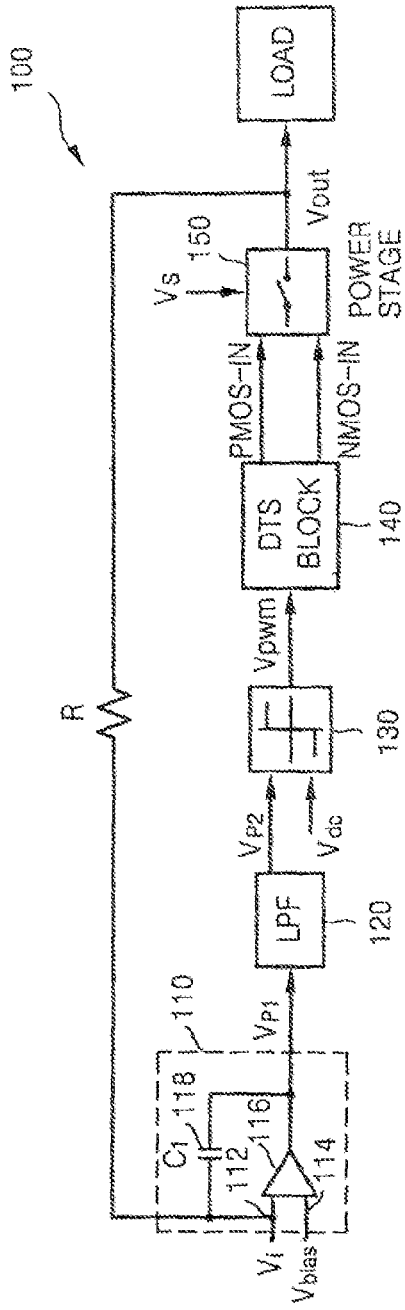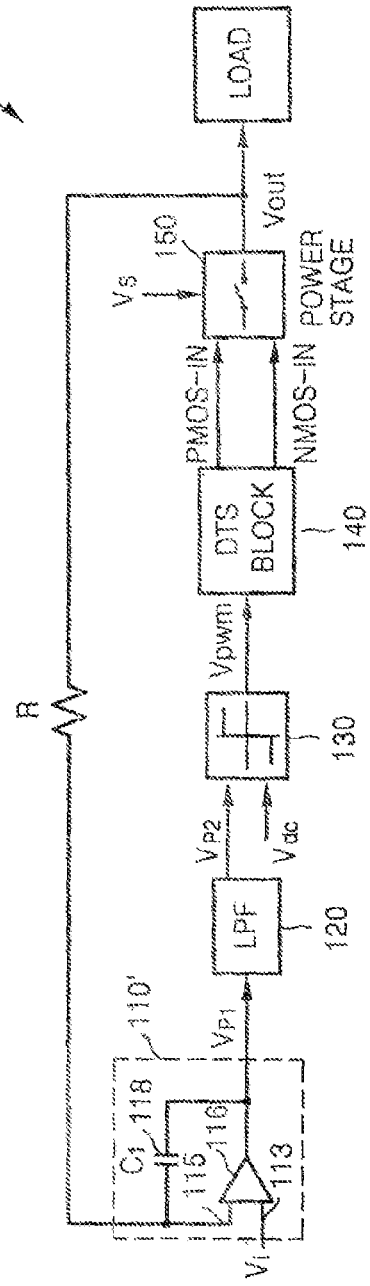

US 7,417,497 B2

PWM MODULATOR AND CLASS-D AMPLIFIER HAVING THE SAME

CROSS-REFERENCE TO RELATED PATENT APPLICATION

This claims priority under 35 U.S.C. § 119 from Korean Patent Application No. 10-2006-0043172, filed on May 13, 2006, the disclosure of which is hereby incorporated by reference herein as if set forth in its entirety.

BACKGROUND OF THE INVENTION

1. Technical Field

The present disclosure relates to a pulse width modulation (PWM) modulator and a class-D amplifier having the same, and more particularly, to a pulse width modulation (PWM) modulator that can reduce electromagnetic interference (EMI), and a class-D amplifier having the same.

2. Discussion of the Related Art

Typically, amplifiers are classified into analog amplifiers and digital amplifiers. The analog amplifiers include class-A amplifiers, class-B amplifiers, and class-AB amplifiers while the digital amplifiers include class-D amplifiers. The efficiency of the analog amplifiers, for example, the class-A amplifier, the class-B amplifier, and the class-AB amplifier, is not good, and the power loss of the analog amplifier is very high. Thus, a lot of heat is generated in the analog amplifier, so that the temperature of the analog amplifier increases.

In the analog amplifier, since a large heat sink or cooling fan is needed to forcibly dissipate the heat generated from the analog amplifier, the size of the analog amplifier is increased. Also, when the temperature of an audio apparatus including the analog amplifier increases, the analog amplifier may be damaged. Furthermore, in the analog amplifier using a vacuum tube or a transistor, distortion of the signal may be unavoidable and is caused by thermal noise due to thermal motion of electrons and the instable linearity of an amplification device, for example, a vacuum tube or a transistor.

In contrast, the class-D amplifier has a high efficiency and is small and light, thus providing portability. Also, since the power consumed that results in heat in the class-D amplifier itself is small, the class-D amplifier is widely used.

FIG. 1 is a functional block diagram of a general class-D amplifier. Referring to FIG. 1, a class-D amplifier 5 includes an input gain stage 10, a PWM modulator 20, and two power stages 30 and 40.

An audio signal input to the input gain stage 10 is an analog signal and may be an input signal of an audio apparatus that is commonly used. The input gain stage 10 receives and amplifies the analog signal. The PWM modulator 20 includes a circuit (not shown) in the form of a comparator, and compares the input analog signal with a predetermined reference and generates a PWM signal according to the result of comparison.

For example, when the level of the input analog signal is greater than that of the reference, the PWM modulator 20 outputs a high level or "1". When the level of the input analog signal is less than that of the reference, the PWM modulator 20 outputs a low level or "0". That is, the PWM modulator 20 generates a PWM signal based on the input analog signal and the reference.

Each of the power stages 30 and 40 receives the PWM signal output from the PWM modulator 20, buffers, and outputs the buffered signal to an inductive load, for example, a speaker. The class-D amplifier 5 is a full bridge type amplifier having the two power stages 30 and 40. The full bridge type amplifier 5 may generate a large output power. Meanwhile, a class-D amplifier using one only power stage is a half bridge type amplifier.

FIG. 2 is a block diagram of a conventional PWM modulator having a ramp generator. As shown in FIG. 2, in a PWM modulator 20 having a ramp generator 23, which is disclosed in U.S. Pat. No. 6,262,632, comparators 40 and 42 respectively receive ramp signals 36 and 38 generated from the ramp generator 23 and output signals of integrators 24 and 26 and respectively generate PWM signals based on the integrated signals and the respective ramp signals 36 and 38.

Since the PWM modulator 20 requires the ramp generator 23 shown in FIG. 2, the structure of the PWM modulator 20 is complicated and difficult to realize. Also, since switching noise of each of the output bridges 28 and 30 can be included in the output signals of the integrators 24 and 26, distortion may be generated in the output signals of the integrators 24 and 26.

FIG. 3 is a block diagram showing a conventional self-oscillation PWM modulator. As shown in FIG. 3, the self-oscillation PWM modulator, which is disclosed in U.S. Pat. No. 6,362,702, does not include the ramp generator unlike the PWM modulator shown in FIG. 2, although it uses two integrators 11 and 12. Since the switching noise at an output terminal 6 of the self-oscillation PWM modulator can be introduced to the integrator 12, an output signal Vb of the integrator 12 can be distorted.

FIG. 4 is a circuit diagram of a conventional power stage of the class-D amplifier. Referring to FIGS. 1 and 4, the power stage 30 of FIG. 4 is a half-bridge type constituting anyone of the power stages 30 and 40 of FIG. 1.

The power stage 30 receives a PMOS input signal PMOS_IN and an NMOS input signal NMOS_IN generated in response to a signal output from the PWM modulator 20. Since a plurality of transistors 31-37 are operated in response to the received input signals PMOS_IN and NMOS_IN, the power stage 30 outputs a high power output signal to a speaker. The conventional power stage 30 includes a power source 39, a plurality of inverters IN1 and IN2, a pull-up transistor 36, and a pull-down transistor 37.

The power stage 30 obtains a high output power by increasing the output current per unit time using the pull-up transistor 36 and the pull-down transistor 37, which have a high ratio of length to width of a channel, hereinafter referred to as the "W/L". Due to this rapid change in the output current, EMI is considerably increased in the power stage 30.

Also, since the switching peak voltage caused by the switching operation of the power stage 30 is high, the power stage 30 generates a lot of harmonic components. The harmonic wave components cause EMI in a surrounding circuit, so that a malfunction of the surrounding circuit may occur.

SUMMARY OF THE INVENTION

To solve the above and/or other problems, exemplary embodiments of the present invention provide a PWM modulator that reduces switching noise and a switching peak voltage of the power stage, so that EMI can be reduced, and a class D amplifier having the same.

According to an exemplary embodiment of the present invention, a PWM modulator comprises an integrator generating an integrated signal based on an input signal and an output signal, a low pass filter (LPF) receiving the integrated signal and performing low pass filtering, a comparator receiving an output signal of the LPF and a predetermined reference signal, comparing the received signals, and outputting a PWM signal, a dead time setup block outputting a first signal and a second signal having a predetermined phase difference based on the PWM signal, and a power stage buffering the first and second signals and generating the output signal based on a result of the buffering.

The integrator comprises an amplifier that includes a first input port receiving the input signal, a second input port receiving a predetermined bias voltage, and an output port outputting the integrated signal, and a capacitor connected between the first input port of the amplifier and the output port of the amplifier, and wherein the first input port receives the output signal output from the power stage.

The integrator comprises an amplifier that includes a first input port receiving the input signal, a second input port receiving the output signal output from the power stage, and an output port outputting the integrated signal, and a capacitor connected between the second input port of the amplifier and the output port of the amplifier. The output signal is input to the integrator through a resistor.

The power stage comprises a first inverter receiving the first signal, a first delay circuit block outputting a plurality of delay signals having different phases to the output port based on an output signal of the first inverter, a second inverter receiving the second signal, and a second delay circuit block outputting a plurality of delay signals having different phases to the output port based on an output signal of the second inverter.

The first delay circuit block comprises a plurality of first transistors, each being turned on/off based on the output signal of the first inverter, and a plurality of first delay circuits, each being connected between gates of two adjacent transistors of the first transistors, and the second delay circuit block comprises a plurality of second transistors, each being turned on/off based on the output signal of the second inverter, and a plurality of second delay circuits, each being connected between gates of two adjacent transistors of the second transistors.

The power stage comprises a plurality of first delay cells, each outputting an output signal having a different phase to the output port in response to the first signal, and a plurality of second delay cells, each outputting an output signal having a different phase to the output port in response to the second signal.

Each of the first delay cells comprises a first inverter receiving the first signal, and a pull-up transistor puling up the output port to a first voltage level in response to an output signal of the first inverter, and each of the second delay cells comprises a second inverter receiving the second signal, and a pull-down transistor pulling down an output port to a second voltage level in response to the output signal of the second inverter.

According to an exemplary embodiment of the present invention, a class-D amplifier comprises a receiver and the above-described PWM modulator.

According to an exemplary embodiment of the present invention, a PWM method comprises generating an integrated signal based on the input signal and an output signal, receiving the integrated signal and performing low pass filtering, comparing a signal that is low pass filtered and a predetermined reference signal and outputting a PWM signal based on a result of the comparison, generating a first signal and a second signal having a predetermined phase difference based on the PWM signal, and buffering the first and second signals and generating the output signal based on a result of the buffering.

The method further comprises sequentially outputting a plurality of signals having different phases as the output signal in response to the first signal, and sequentially outputting a plurality of signals having different phases as the output signal in response to the second signal.

BRIEF DESCRIPTION OF THE DRAWINGS

Exemplary embodiments of the present invention will be understood in more detail from the following descriptions taken in conjunction with the attached drawings in which:

FIG. 5 is a functional block diagram of a PWM modulator according to an exemplary embodiment of the present invention;

FIG. 6 is a functional block diagram of a PWM modulator according to an exemplary embodiment of the present invention;

DETAILED DESCRIPTION OF EXEMPLARY EMBODIMENTS

Figure 1:
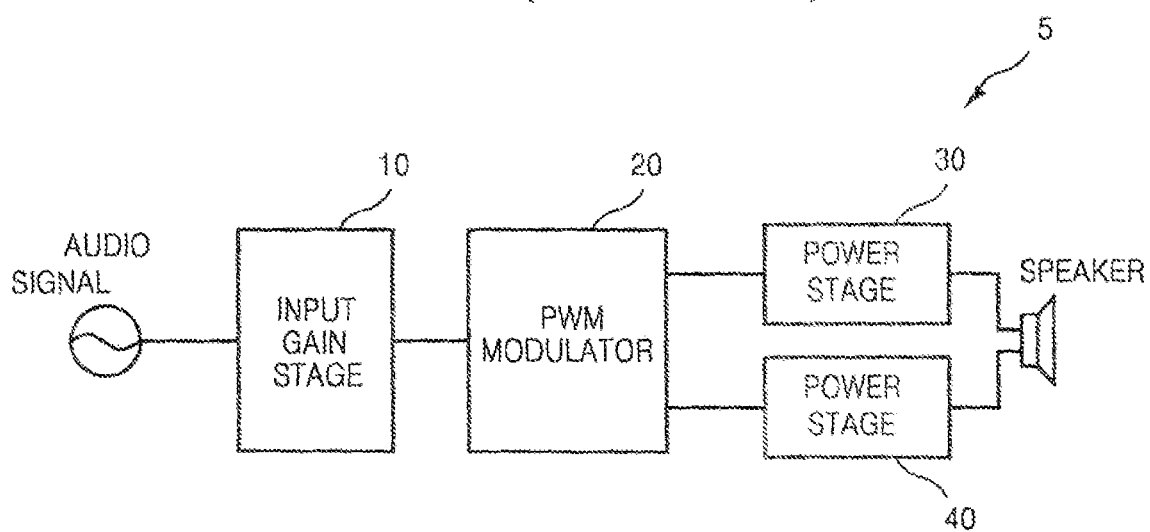
FIG. 1 is a functional block diagram of a general class-D amplifier.
Figure 2:
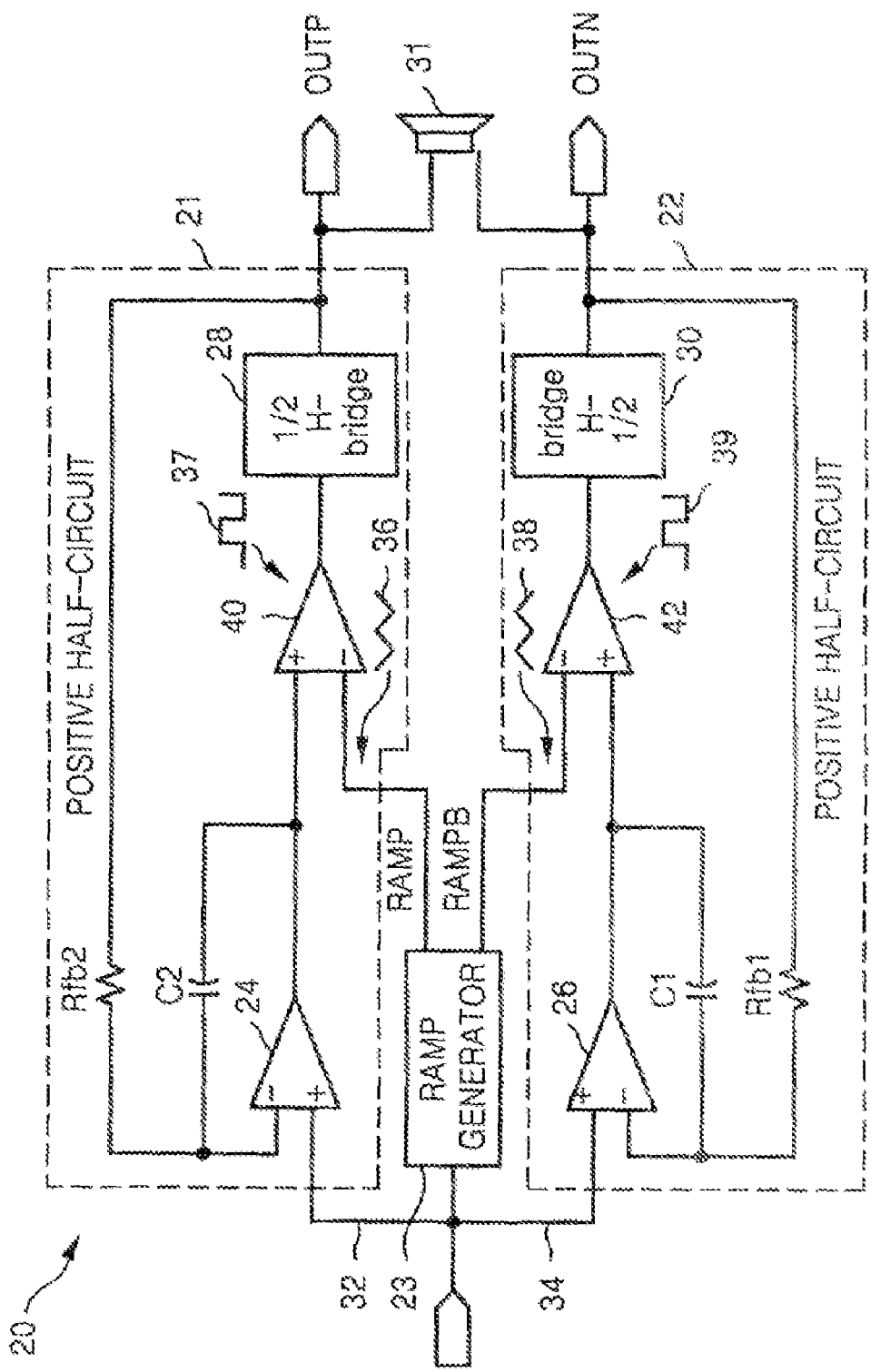
FIG. 2 is a block diagram of a conventional PWM modulator having a ramp generator.
Figure 3:
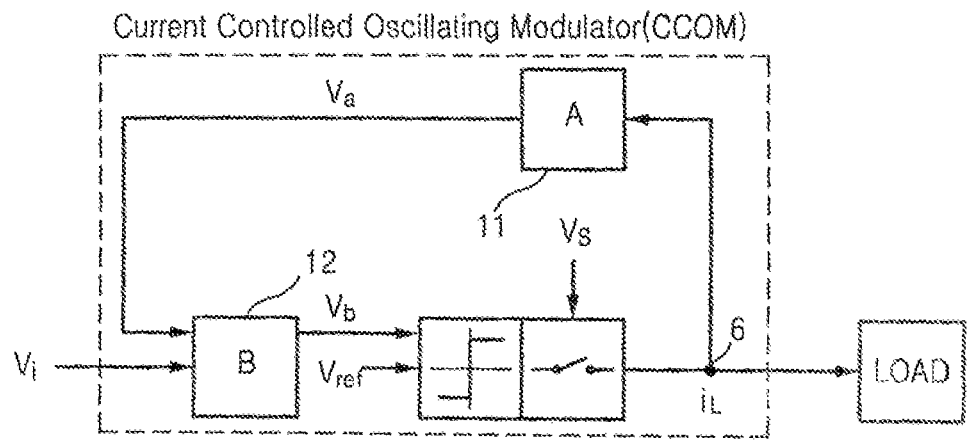
FIG. 3 is a block diagram of a conventional self-oscillation PWM modulator.
Figure 4:
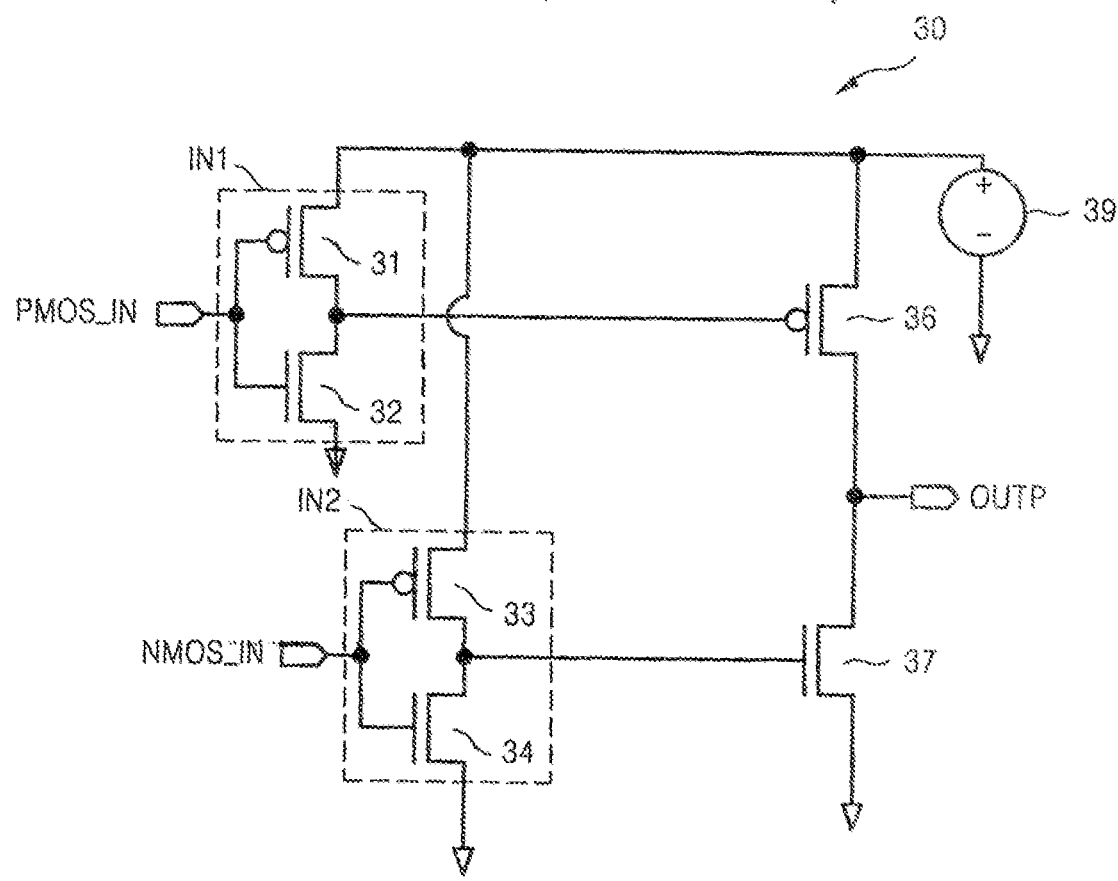
FIG. 4 is a circuit diagram of a conventional power stage of the class-D amplifier shown in FIG. 1.

The attached drawings for illustrating exemplary embodiments of the present invention are referred to in order to gain a sufficient understanding of the present invention, the merits thereof, and the objectives accomplished by the implementation of the present invention. Hereinafter, the present invention will be described in detail by explaining exemplary embodiments of the invention with reference to the attached drawings. Like reference numerals in the drawings denote like elements.

FIGS. 5 and 6 are functional block diagrams of PWM modulators according to exemplary embodiments of the present invention. Referring to FIGS. 5 and 6, a PWM modulator 100 includes an integrator 110 (or 110'), a low pass filter (LPF) 120, a comparator 130, a dead time setup (DTS) block 140, and a power stage 150.

The integrator 110 (or 110') generates an integrated signal Vp1 in response to an input signal Vi and an output signal Vout. The input signal Vi is an analog signal. As shown in FIG.

5, the integrator 110 includes an amplifier 116 and a capacitor C1 118. The amplifier 116 includes a first input port (or terminal) 112 receiving the input signal Vi, a second input port 114 receiving a predetermined bias voltage Vbias, and an output port outputting the integrated signal Vp1. The capacitor C1 118 is connected between the first input port 112 and the output port of the amplifier 116. The first input port 112 also receives the output signal Vout output from the power stage 150.

As shown in FIG. 6, the integrator 110' includes the amplifier 116 and the capacitor C1 118. The amplifier 116 includes a first input port 113 receiving the input signal Vi, a second input port 115 receiving the output signal Vout output from the power stage 150, and an output port outputting the integrated signal Vp1. The capacitor C1 118 is connected between the second input port 115 and the output port of the amplifier 116.

The output signal Vout of the power stage 150 is input to the integrator 110 (or 110') through a resistor R. Alternatively, the output signal Vout of the power stage 150 can be input to the integrator 110 (or 110') through a predetermined inverter or inverter chain (not shown).

The LPF 120 receives the integrated signal Vp1 to perform low pass filtering. High frequency noise such as jitter noise caused by the comparator 130 and/or switching noise caused by the power stage 150 is introduced into the integrator 110 or 110'. When the cut-off frequency of the low pass filter 120 is set to be low, the LPF 120 can remove the high frequency noise. Thus, the PWM modulator 100 according to an exemplary embodiment of the present invention has the effect of improving a noise characteristic.

The comparator 130 receives an output signal Vp2 of the LPF 120 and a predetermined reference signal Vdc and generates a PWM signal Vpwm by comparing both signals. For example, when the level of the output signal Vp2 of the LPF 120 is greater than that of the reference signal Vdc, the comparator 130 outputs a level "HIGH" or "1". When the level of the output signal Vp2 of the LPF 120 is less than that of the reference signal Vdc, the comparator 130 outputs a level "LOW" or "0". Thus, the comparator 130 performs pulse width modulation of the output signal Vp2 of the LPF 120 based on the reference signal Vdc.

The dead time setup block 140 outputs a first signal PMOS_IN and a second signal NMOS_IN having a predetermined phase difference therebetween, based on the PWM signal Vpwm. The power stage 150 buffers each of the first signal PMOS_IN and the second signal NMOS_IN and generates the output signal Vout as a result of the buffering.

Figure 7:
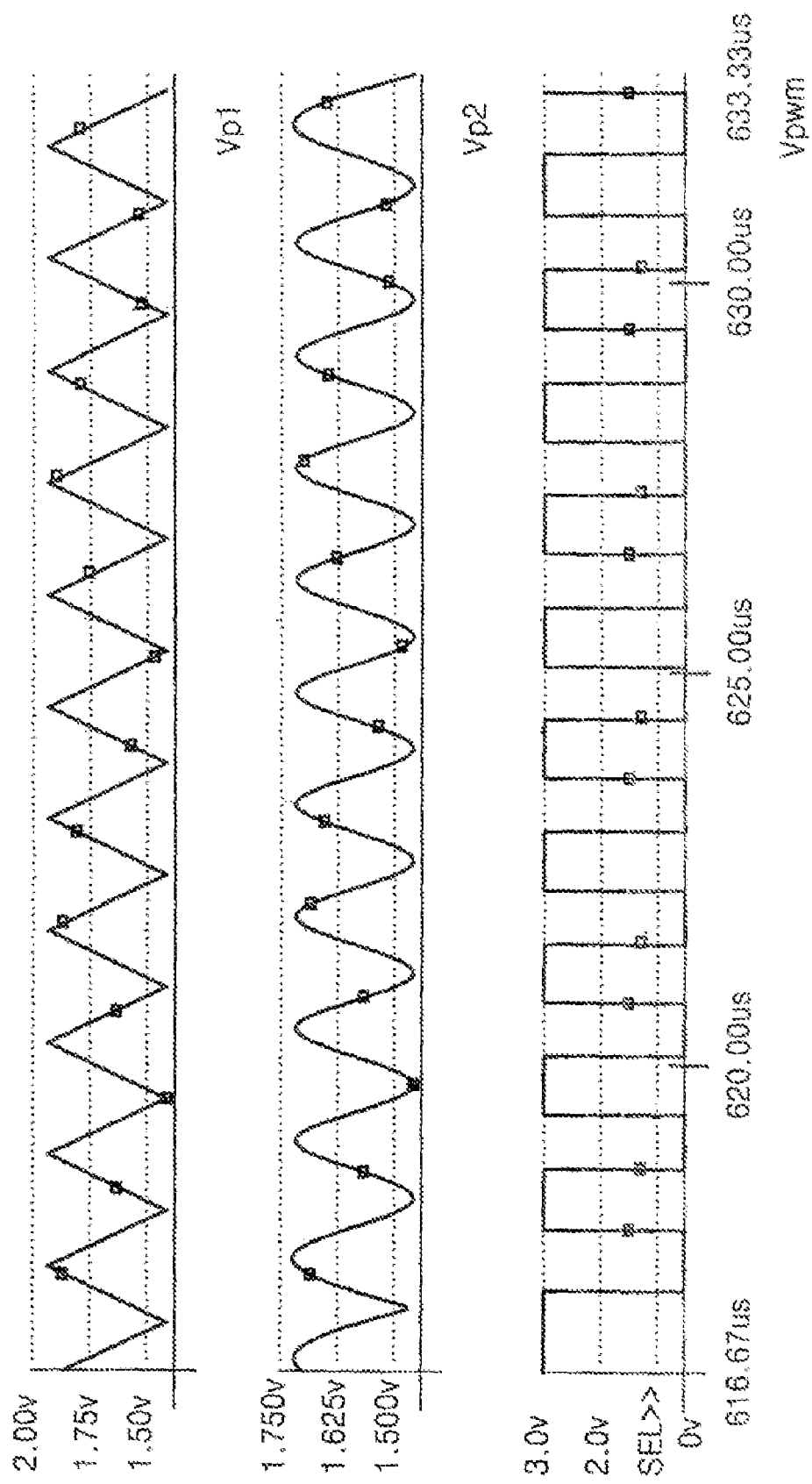
FIG. 7 is a graph showing the waveform of self-oscillation when no input signal exits in the PWM modulator according to an exemplary embodiment of the present invention.

FIG. 7 is a graph showing the waveform of self-oscillation when no input signal exits in the PWM modulator according to an exemplary embodiment of the present invention. Referring to FIG. 5 through FIG. 7, the PWM modulator 100 according to the present invention does not include a ramp generator. When the input signal Vi does not exist, the output signal Vp1 of the integrator 110 becomes a triangle wave in which the rise time and the fall time are identical.

The LPF 120 removes a high frequency component included in the integrated signal Vp1 and outputs the signal Vp2 with the high frequency wave component removed. The signal Vp2 output from the low pass filter 120 is output through the comparator 130, the dead time setup block 140, and the power stage 150. When no input signal Vi exists, for example, when the input signal Vi is AC-grounded, the duty ratio of the PWM signal Vpwm shown in FIG. 7 is 50%.

Figure 8:
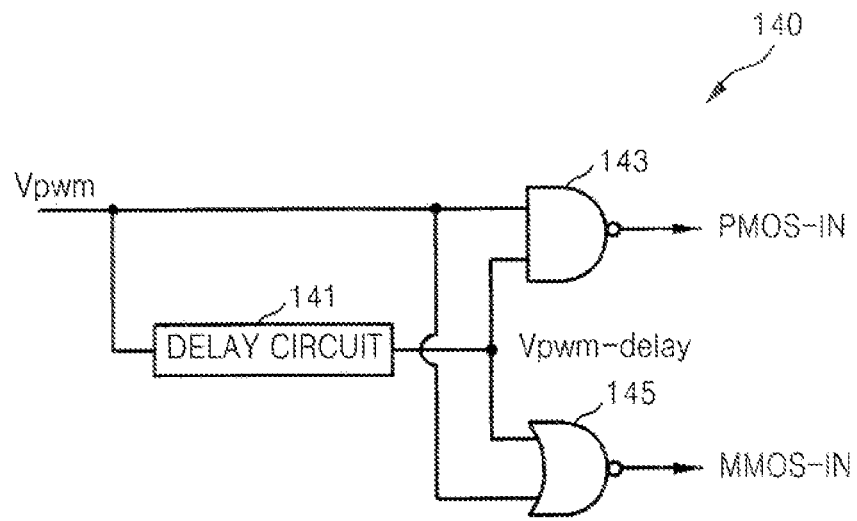
FIG. 8 is a circuit diagram of a dead time setup block used in the circuits shown in FIGS. 5 and 6.
Figure 9:
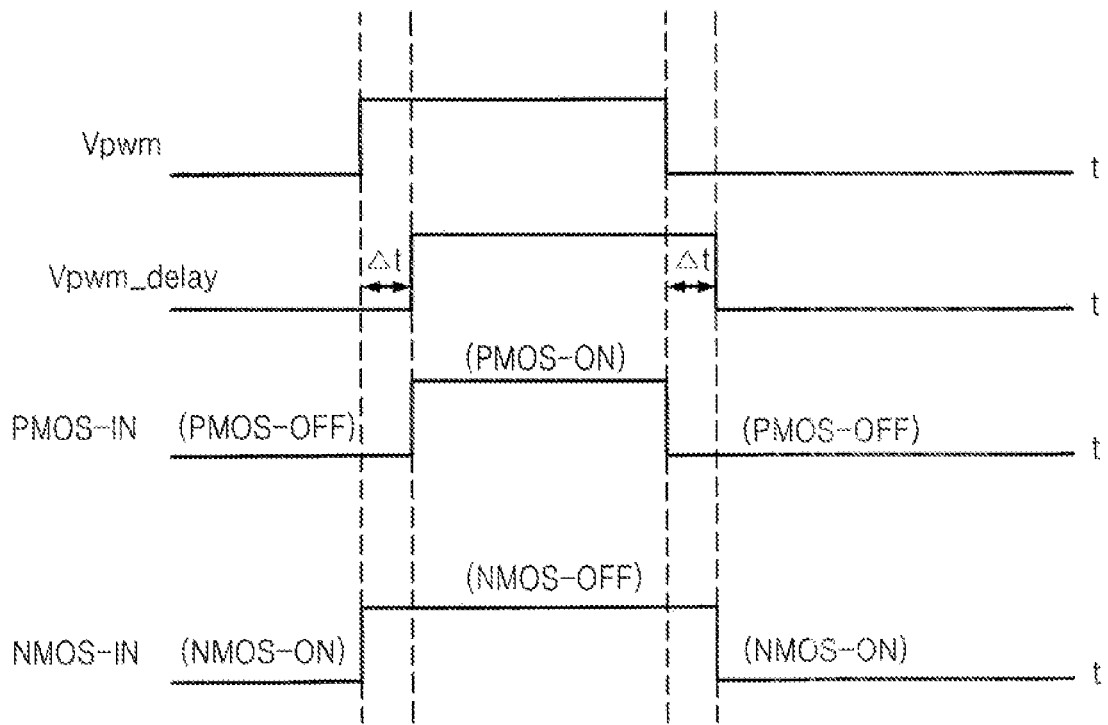
FIG. 9 is a timing diagram showing the waveform of an input signal and an output signal of the dead time setup block shown in FIG. 8.

FIG. 8 is a circuit diagram of the dead time setup block 140 shown in FIGS. 5 and 6. FIG. 9 is a timing diagram showing the waveforms of an input signal and an output signal of the dead time setup block 140 shown in FIG. 8. Referring to FIGS. 8 and 9, the dead time setup block 140 includes a delay circuit 141, a NAND gate 143, and a NOR gate 145.

The delay circuit 141 receives a PWM signal Vpwm, delays the received signal for a predetermined time, and outputs a delayed PWM signal Vprm-delay. The NAND gate 143 generates the first signal PMOS_IN based on the PWM signal Vpwm and the output signal Vpwm-delay of the delay circuit 141. The NOR gate 145 generates the second signal NMOS_IN based on the PWM signal Vpwm and the output signal Vpwm-delay of the delay circuit 141.

Figure 10:
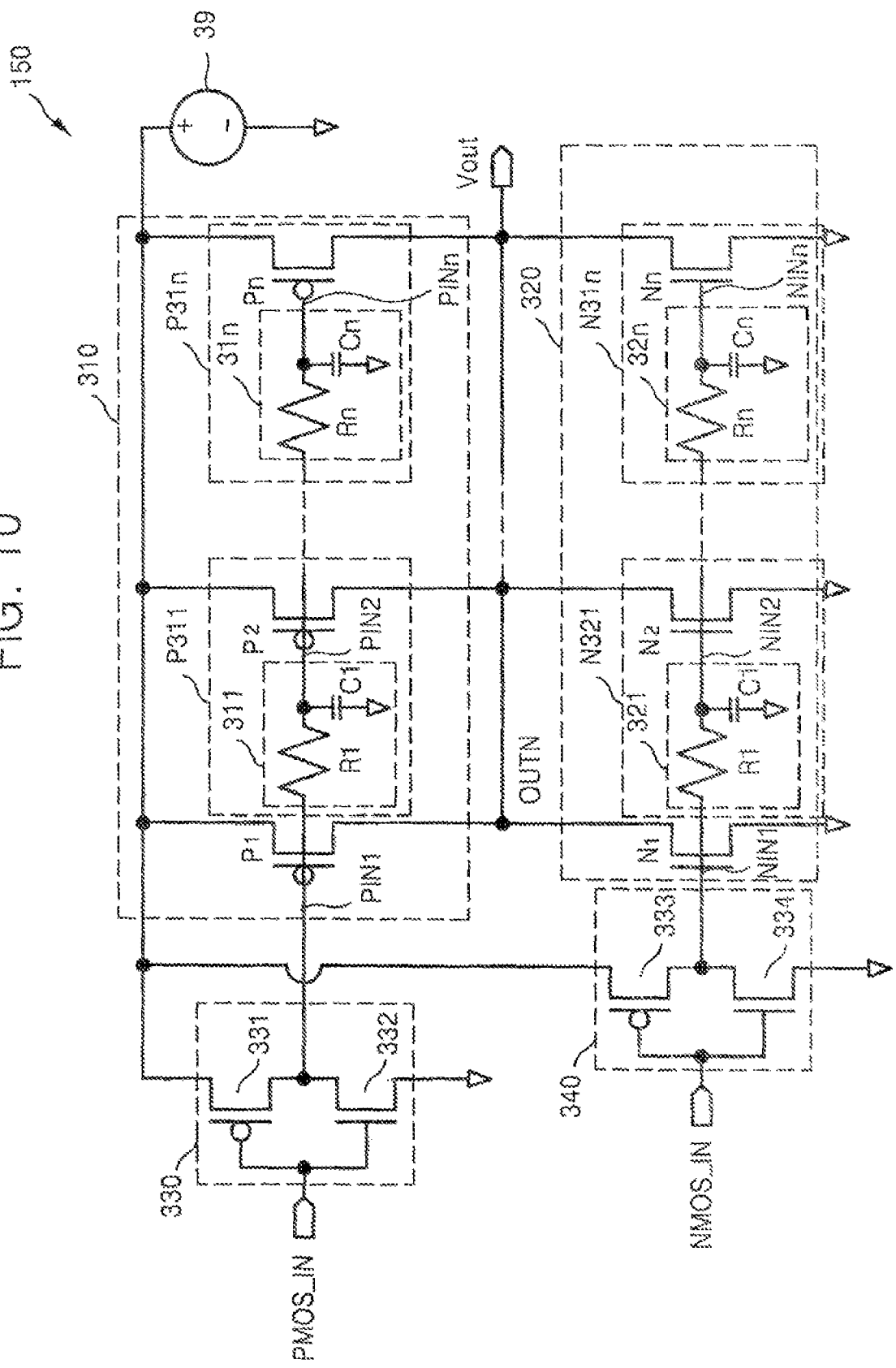
FIG. 10 is a circuit diagram of a power stage of the PWM modulator shown in FIGS. 5 and 6 according to an exemplary embodiment of the present invention.

FIG. 10 is a circuit diagram of a power stage of the PWM modulator shown in FIGS. 5 and 6 according to an exemplary embodiment of the present invention. Referring to FIG. 10, the power stage 150 includes a first delay circuit block 310, a second delay circuit block 320, a first inverter 330, a second inverter 340. The first delay circuit block 310 includes a plurality of pull-up transistors P1 through Pn and a plurality of pull-up delay circuits 311 through 31n. The second delay circuit block 320 includes a plurality of pull-down transistors N1 through Nn and a plurality of pull-down delay circuits 321 and 32n.

Each of the pull-up transistors P1 through Pn can be embodied by a PMOS transistor. Each of the pull-down transistors N1 through Nn can be embodied by an NMOS transistor. Each of the pull-up transistors P1 through Pn is connected in parallel between a power source 39 and an output node OUTN and turned on/off in response to a corresponding input signal among input signals PIN1 through PINn. The power source 39 generates a predetermined voltage Vs.

Each of the pull-down transistors N1 through Nn is connected in parallel between the output node OUTN and ground and turned on/off in response to a corresponding input signal among input signals NIN1 through NINn. The phases of the corresponding input signals NIN1 through NINn are different from each other.

The first inverter 330 receives and inverts the first signal PMOS_IN and generates an inverted signal PIN1. The second inverter 340 receives and inverts the second signal NMOS_IN and generates an inverted signal NIN1.

The first delay circuit block 310 generates a plurality of delay signal PIN2 through PINn having different delay times or phases in response to the output signal PIN1 of the first inverter 330. Thus, the time when each pull-up transistor P2 through Pn is turned on or off is different. The second delay circuit block 320 generates a plurality of delay signals NIN2 through NINn having different delay times or phases in response to the output signal NIN1 of the second inverter 340. Thus, the time when each pull-down transistor N2 through Nn is turned on or off is different.

The respective delay circuits 311 and 31n and 321 through 32n can be embodied using a resistor R and a capacitor C, but are not limited thereto. A delay time or a time constant is determined by the values of the resistor R and the capacitor C. Each of P311 through P31n and N321 through N32n constitutes a unit delay circuit.

Figure 11:
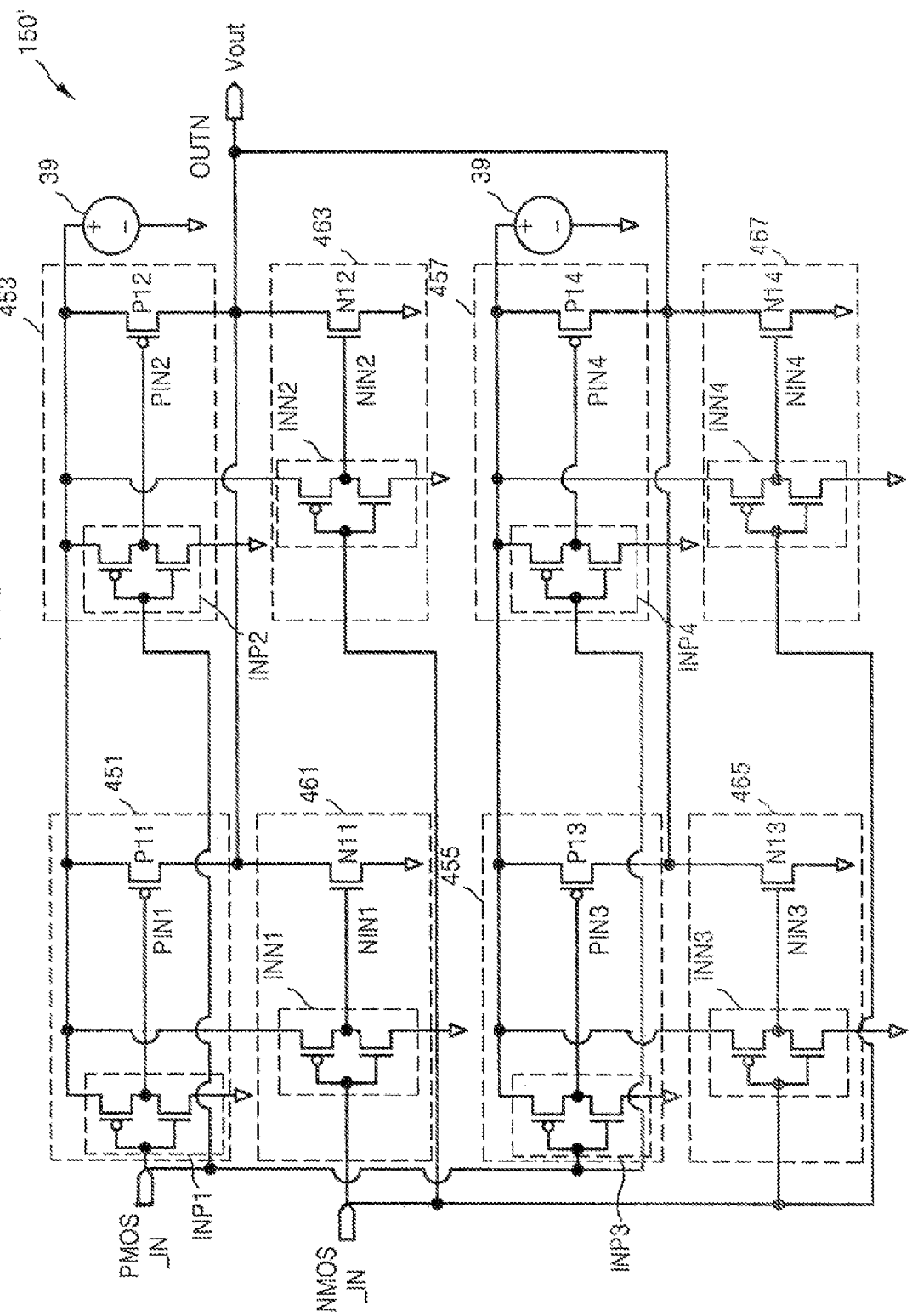
FIG. 11 is an another circuit diagram of a power stage of the PWM modulator shown in FIGS. 5 and 6 according to an exemplary embodiment of the present invention.

FIG. 11 is a circuit diagram of a power stage of the PWM modulator shown in FIGS. 5 and 6 according to an exemplary embodiment of the present invention. Referring to FIG. 11, the power stage 150' includes a plurality of first delay cells, 451, 453, 455, and 457 and a plurality of second delay cells 461, 463, 465, and 467.

Each of the first delay cells 451, 453, 455, and 457 includes a corresponding inverter INP1, INP2, INP3, and INP4 and a corresponding pull-up transistor P11, P12, P13, and P14. Each of the pull-up transistors P11 through P14 is connected between the power source 39 and the output node OUTN.

Each of the inverters INP1 through INP4 receives and inverts the first signal PMOS_IN and outputs a corresponding inverted signal PIN1 through PIN4. Each of the pull-transistors P11 through P14 is turned on/off in response to the corresponding inverted signal PIN1 through PIN4 that is input to a gate of each pull-up transistor.

Each of the second delay cells 461, 463, 465, and 467 includes a corresponding inverter INN1, INN2, INN3, and INN4 and a corresponding pull-down transistor N11, N12, N13, and N14. Each of the pull-down transistors N11 through N14 is connected between the output node OUTN and ground. Each of the inverters INN1 through INN4 receives the second signal NMOS_IN and outputs the corresponding inverted signal NIN1 through NIN4. Each of the pull-down transistors N11 through N14 is turned on/off in response to the corresponding inverted signal NIN1 through NIN4 that is input to a gate of each pull-up transistor.

Each of the inverters INP1 and INP4 is formed of a PMOS transistor and an NMOS transistor. It is preferable that the width/length (W/L) ratio of each of the inverters INP1 through INP4 is different from each other, but is not limited thereto. For example, the W/L of the first inverter INP1 is preferably greater than that of each of the second through fourth inverters INP2 through INP4. Although it is preferable that the W/L of each of the pull-up transistors P11 through P14 is identical, the W/L may also be embodied different from each other. Although it is preferable that the W/L of each of the pull-down transistors N11 through N14 is identical, the W/L may also be embodied different from each other.

The slew rate or the time to buffer the first signal PMOS_IN varies according to the size of the W/L of each of the first through fourth inverters INP1 through INP4. When the W/L of each of the first through fourth inverters INP1 through INP4 decreases, the turn-on resistance of each of the first through inverters INP1 through INP4 sequentially increases.

The slew rate of the first inverter INP1 is greater than that of each of the second through fourth inverters INP2 through INP4. Since the first pull-up transistor P11 is turned on in response to the output signal PIN1 of the first inverter INP1, the first pull-up transistor P11 pulls up the output node OUTN to a voltage, for example, a first voltage, that is slightly lower than the voltage of the power source 39.

When the W/L of the second inverter INP2 is less than that of the first inverter INP1 and greater than that of each of the third and fourth inverters INP3 and INP4, the output signal PIN2 of the second inverter INP2 is output later than the output signal PIN1 of the first inverter INP1. Thus, the second pull-up transistor P12 can be turned on later than the first pull-up transistor P11.

The second pull-up transistor P12 pulls up the output node OUTN to the first voltage. The third pull-up transistor P13 pulls up the output node OUTN to the first voltage later than the second pull-up transistor P12. The fourth pull-up transistor P14 pulls up the output node OUTN to the first voltage later than the third pull-up transistor P13. Thus, the output voltage Vout is determined by the respective pull-up transistors P11, P12, P13, and P14.

When the W/L of the fifth inverter INN1 is greater than that of the sixth inverter INN2, the W/L of the sixth inverter INN2 is greater than that of the seventh inverter INN3, and the W/L of the seventh inverter INN3 is greater than that of the eighth inverter INN4, the second pull-down transistor N12 pulls down the output node OUTN to the first voltage, for example, ground, later than the first pull-down transistor N11, the third pull-down transistor N13 later than the second pull-down transistor N12, and the fourth pull-down transistor N14 later than the third pull-down transistor N13.

In the manufacturing process, by adjusting the W/L of the PMOS transistor and the W/L of the NMOS transistor that constitute each of the inverters INP1, INP2, INP3, INP4, INN1, INN2, INN3, and INN4, the slew rate of the first signal PMOS_IN and/or the slew rate of the second signal NMOS_IN can be adjusted.

Also, in the manufacturing process, by adjusting the W/L of each of the pull-up transistors P11, P12, P13, and P14 and/or the W/L of each of the pull-down transistors N11, N12, N13, and N14, a speed to pull up the output node OUTN and/or a speed to pull down the output node OUTN can be adjusted.

In the exemplary embodiment, the W/L of each of the first through fourth pull-up transistors P11 through P14 is embodied to be identical and the W/L of each of the first through fourth pull-down transistors N11 through N14 is embodied to be identical. In order to sequentially turn on/off each of the first through fourth pull-up transistors P11 through P14 with a predetermined time difference according to the exemplary embodiments, however, the W/L of each of the first through fourth pull-up transistors P11 through P14 can be embodied different from one another.

Although the W/L of the fifth inverter INN1 is identical to that of the first inverter INP1, the present invention is not limited thereto. Although the W/L of the sixth inverter INN2 is identical to that of the second inverter INP2, the present invention is not limited thereto. Although the W/L of the seventh inverter INN3 is identical to that of the third inverter INP3, the present invention is not limited thereto. Although the W/L of the eighth inverter INN4 is identical to that of the fourth inverter INP4, the present invention is not limited thereto.

Figure 12:
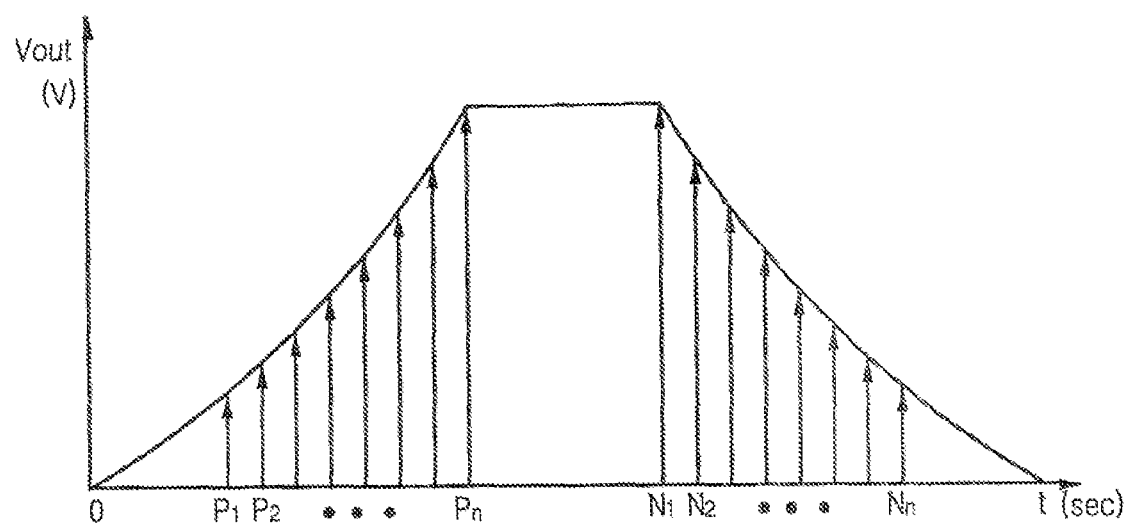
FIG. 12 is a graph showing the output voltage of the power stage of the PWM modulator of FIGS. 5 and 6.

FIG. 12 is a graph showing the output voltage of the power stage of the PWM modulator of FIGS. 5 and 6. Referring to FIGS. 5, 6, and 10 through 12, the change of the output voltage Vout according to the sequential turn-on of the respective pull-up transistors P1 through Pn and the respective pull-down transistors N1 through Nn is shown. In the graph of FIG. 12, the X-axis denotes the time when the respective pull-up transistors P1 through Pn and the respective pull-down transistors N1 through Nn are turned on while the Y-axis denotes the level of the output voltage Vout.

Referring to the circuit of FIG. 10, the first pull-up transistor P1 is turned on in response to the output signal PIN1 of the first inverter 330. The first delay circuit 311 delays the output signal PIN1 of the first inverter 330 for a predetermined time. The second pull-up transistor P2 is turned on in response to the output signal PIN2 of the first delay circuit 311. As described above, each of the second pull-up transistor P2 through the $n^{th}$ pull-up transistor Pn is turned on in response to a corresponding signal. Thus, since the respective pull-up transistors P1 through Pn are sequentially turned on, the output voltage Vout also sequentially increases.

The first pull-down transistor N1 is turned on in response to the output signal NIN1 of the second inverter 340. The first delay circuit 321 delays the output signal NIN1 of the second inverter 340 for a predetermined time. The second pull-down transistor N2 is turned on in response to the first delay circuit 321. Each of the second pull-down transistor N2 through the $N^{th}$ pull-down transistor Nn is turned on in response to an output signal of the corresponding delay circuit. Thus, since the respective pull-down transistors N1 through Nn are sequentially turned on, the output voltage Vout sequentially decreaes.

Figure 13A:
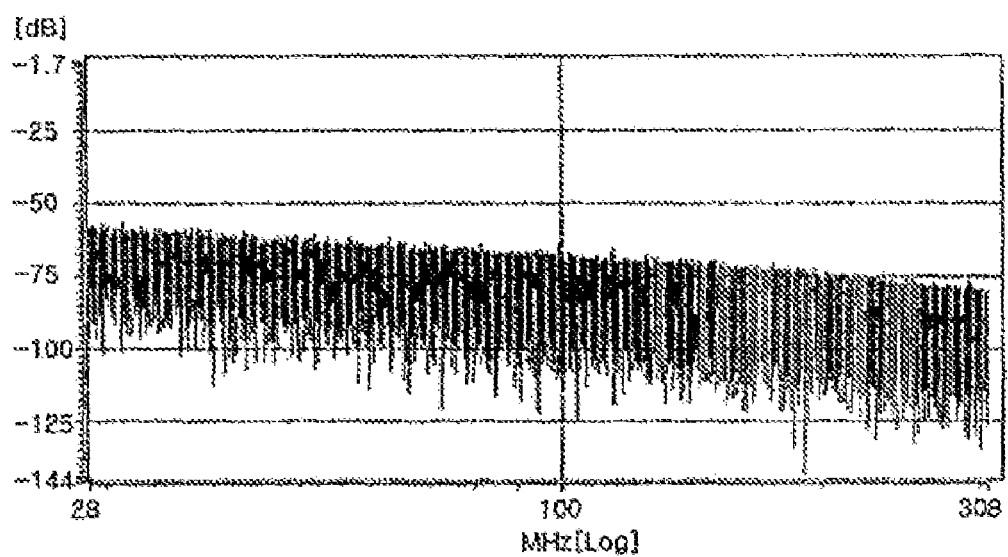
FIG. 13A is a graph showing the spectrum of the output signal of a conventional PWM modulator.
Figure 13B:
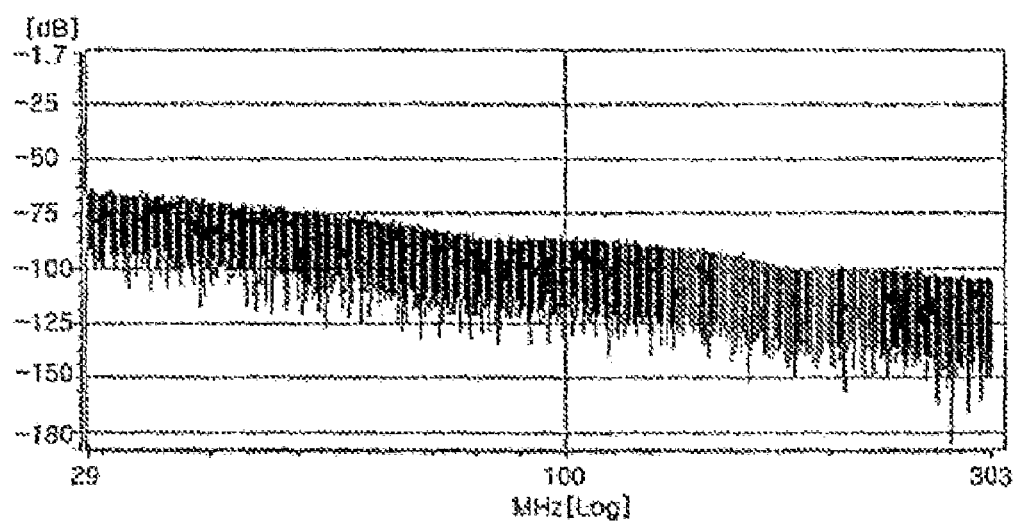
FIG. 13B is a graph showing the spectrum of the output signal of the PWM modulator shown in FIGS. 5 and 6.

FIGS. 13A and 13B respectively are graphs showing the spectrums of the output signals of the conventional PWM modulator and the PWM modulator shown in FIGS. 5 and 6.

In FIGS. 13A and 13B, the horizontal axis denotes a frequency (MHz) while the vertical axis denotes the dB value of the output voltage Vout.

FIG. 13A shows that a high order harmonic frequency with respect to a waveform of the output voltage is high. Accordingly, the change of the output to the input is radical so that EMI occurs. FIG. 13B shows that the high order harmonic frequency of the output voltage is low compared to that of FIG. 13A. That is, the PWM modulator 100 according to exemplary embodiments of the present invention can sequentially increase or decrease the output voltage Vout. Thus, since the change rate of the output voltage Vout is decreased, the EMI can be reduced.

Figure 14:
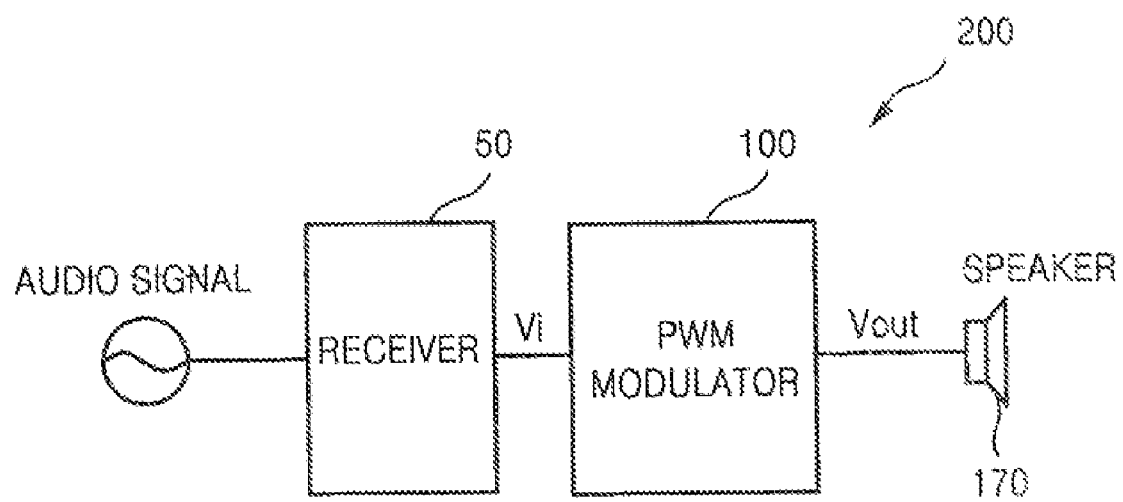
FIG. 14 is a block diagram of a class-D amplifier having the PWM modulator according to an exemplary embodiment of the present invention.

FIG. 14 is a block diagram of a class-D amplifier having the PWM modulator according to an exemplary embodiment of the present invention. Referring to FIGS. 5, 6, and 14, a class-D amplifier 200 includes a receiver 50, a PWM modulator 100, and a speaker 170.

The receiver 50 receives a predetermined analog signal, for example, an audio signal, and generates an input signal Vi of the PWM modulator 100. The receiver 50 may include an amplification circuit (not shown) amplifying the analog signal and/or an LPF (not shown) performing low pass filtering when receiving the analog signal.

The PWM modulator 100 converts the input signal Vi to a PWM signal and, as shown in FIGS. 5 and 6, includes the integrator 110 (or 110'), the LPF 120, the comparator 130, the dead time setup block 140, and the power stage 150. The speaker 170 is an inductive load connected to the power stage 150 of the PWM modulator 100 and outputs an amplified signal.

As described above, according to exemplary embodiments of the present invention, the structure of the self-oscillating PWM modulator is simple. Since the self-oscillating PWM modulator can sequentially increase and decrease the output voltage, EMI can be reduced. The class-D amplifier having the self-oscillating PWM modulator according to exemplary embodiments of the present invention has a simple structure and can remove the jitter noise caused by the comparator and the switching noise of the power stage so that noise and EMI can be reduced.

While this invention has been particularly shown and described with reference to exemplary embodiments thereof, it will be understood by those skilled in the art that various changes in form and details may be made therein without departing from the spirit and scope of the invention as defined by the appended claims.

What is claimed is:

1. A pulse width modulation (PWM) modulator comprising:
    an integrator generating an integrated signal based on an input signal fed thereto and an output signal thereof;
    an low pass filter (LPF) receiving the integrated signal and performing low pass filtering;
    a comparator receiving an output signal of the LPF and a predetermined reference signal, comparing the received signals, and outputting a PWM signal;
    a dead time setup block outputting a first signal and a second signal having a predetermined phase difference therebetween based on the PWM signal; and
    a power stage buffering the first and second signals from the dead time setup block and generating an output signal of the modulator based on a result of the buffering.

2. The PWM modulator of claim 1, wherein the integrator comprises:
    an amplifier that includes a first input port receiving the input signal, a second input port receiving a predetermined bias voltage, and an output port outputting the integrated signal; and
    a capacitor connected between the first input port of the amplifier and the output port of the amplifier,
    wherein the first input port receives the output signal output from the power stage.

3. The PWM modulator of claim 1, wherein the integrator comprises:
    an amplifier that includes a first input port receiving the input signal, a second input port receiving the output signal output from the power stage, and an output port outputting the integrated signal; and
    a capacitor connected between the second input port of the amplifier and the output port of the amplifier.

4. The PWM modulator of claim 1, wherein the output signal is input to the integrator through a resistor.

5. The PWM modulator of claim 1, wherein the power stage comprises:
    a first inverter receiving the first signal from the dead time setup block;
    a first delay circuit block outputting a plurality of delay signals having different phases to an output port based on an output signal of the first inverter;
    a second inverter receiving the second signal from the dead time setup block; and
    a second delay circuit block outputting a plurality of delay signals having different respective phases to the output port based on an output signal of the second inverter.

6. The PWM modulator of claim 5, wherein the first delay circuit block comprises:
    a plurality of first transistors, each being turned on/off based on the output signal of the first inverter; and
    a plurality of first delay circuits, each being connected between gates of two adjacent transistors of the plurality of first transistors,
    the second delay circuit block comprises:
    the plurality of second transistors, each being turned on/off based on the output signal of the second inverter; and
    a plurality of second delay circuits, each being connected between gates of two adjacent transistors of the plurality of second transistors.

7. The PWM modulator of claim 1, wherein the power stage comprises:
    a plurality of first delay cells, each outputting an output signal having a different phase to an output port in response to the first signal from the dead time setup block; and
    a plurality of second delay cells, each outputting an output signal having a different phase to the output port in response to the second signal from the dead time setup block.

8. The PWM modulator of claim 7, wherein each of the first delay cells comprises:
    a first inverter receiving the first signal from the dead time setup block; and
    a pull-up transistor puling up the output port to a first voltage level in response to an output signal of the first inverter,
    each of the second delay cells comprises:
    a second inverter receiving the second signal from the dead time setup block; and
    a pull-down transistor pulling down the output port to a second voltage level in response to an output signal of the second inverter.

9. A class-D amplifier comprising:
a receiver generating an input signal in response to a predetermined analog signal fed thereto; and
a PWM modulator receiving the input signal output from the receiver and converting the received input signal to a PWM signal,
wherein the PWM modulator includes:
an integrator generating an integrated signal based on the input signal output from the receiver and an output signal output from a output port of the class D amplifier;
an low pass filter (LPF) receiving the integral signal and performing low pass filtering;
a comparator receiving an output signal of the LPF and a determined reference signal, comparing the received signals, and outputting a PWM signal;
a dead time setup block outputting a first signal and a second signal having a predetermined phase difference therebetween based on the PWM signal; and
a power stage buffering the first signal and the second signal from the dead time setup block and generating an output signal of the amplifier based on a result of the buffering.

10. The class-D amplifier of claim 9, wherein the output signal is input to the integrator through a resistor.

11. The class-D amplifier of claim 9, wherein the power stage comprises:
a first inverter receiving the first signal from the dead time setup block;
a first delay circuit block outputting a plurality of delay signals having different phases to an output port based on an output signal of the first inverter;
a second inverter receiving the second signal from the dead time setup block; and
a second delay circuit block outputting a plurality of delay signals having different phases to the output port based on an output signal of the second inverter.

12. The class-D amplifier of claim 11, wherein the first delay circuit block comprises:
a plurality of first transistors, each being turned on/off based on the output signal of the first inverter; and
a plurality of first delay circuits, each being connected between gates of two adjacent transistors of the plurality of first transistors,
the second delay circuit block comprises:
a plurality of second transistors, each being turned on/off based on the output signal of the second inverter;
a plurality of second delay circuits, each being connected between gates of two adjacent transistors of the plurality of second transistors.

13. The class-D amplifier of claim 9, wherein the power stage comprises:
a plurality of first delay cells, each outputting an output signal having a different respective phase to an output port in response to the first signal; and
a plurality of second delay cells, each outputting an output signal having a different respective phase to the output port in response to the second signal.

14. The class-D amplifier of claim 13, wherein each of the first delay circuits comprises:
a first inverter receiving the first signal from the dead time setup block; and
a pull-up transistor puling up the output port to a first voltage level in response to an output signal of the first inverter,
each of the second delay circuits comprises:
a second inverter receiving the second signal from the dead time setup block; and
a pull-down transistor pulling down the output port to a second voltage level in response to an output signal of the second inverter.

15. A pulse width modulation (PWM) method comprising:
generating an integrated signal based on an input signal and an output signal;
receiving the integrated signal and performing low pass filtering thereon;
comparing a low-pass filtered signal and a predetermined reference signal and outputting a PWM signal based on a result of comparison;
generating a first signal and a second signal having a predetermined phase difference therebetween based on the PWM signal; and
buffering the first and second signals and generating a modulated output signal based on a result of the buffering.

16. The method of claim 15, further comprising:
sequentially outputting a plurality of signals having different respective phases as the output signal in response to the first signal from the step of generating; and
sequentially outputting a plurality of signals having different respective phases as the output signal in response to the second signal from the step of generating.

* * * * *